(12) United States Patent
Petrov et al.

(10) Patent No.: US 11,808,892 B2
(45) Date of Patent: Nov. 7, 2023

(54) METHODS FOR DRIVING OPTICAL LOADS AND DRIVER CIRCUITS FOR OPTICAL LOADS

(71) Applicant: Lumentum Operations LLC, San Jose, CA (US)

(72) Inventors: Konstantin Petrovich Petrov, Sunnyvale, CA (US); Mikhail Dolganov, Gilroy, CA (US)

(73) Assignee: Lumentum Operations LLC, San Jose, CA (US)

( * ) Notice: Subject to any disclaimer, the term of this patent is extended or adjusted under 35 U.S.C. 154(b) by 661 days.

(21) Appl. No.: 16/827,327

(22) Filed: Mar. 23, 2020

(65) Prior Publication Data

US 2020/0333438 A1     Oct. 22, 2020

Related U.S. Application Data

(60) Provisional application No. 62/836,556, filed on Apr. 19, 2019.

(51) Int. Cl.
| | |
|---|---|
| *H04B 10/50* | (2013.01) |
| *G01S 7/484* | (2006.01) |
| *H01S 5/042* | (2006.01) |
| *H04B 10/524* | (2013.01) |

(52) U.S. Cl.
CPC ............ *G01S 7/484* (2013.01); *H01S 5/0428* (2013.01); *H04B 10/50* (2013.01); *H04B 10/524* (2013.01)

(58) Field of Classification Search
CPC ........ G01S 7/484; G01S 17/10; H01S 5/0428; H01S 5/423; H04B 10/50; H04B 10/524; H05B 47/195; H05B 45/32; H02M 11/00

USPC .................................................. 398/182–201
See application file for complete search history.

(56) References Cited

U.S. PATENT DOCUMENTS

| | | | | |
|---|---|---|---|---|
| 5,977,565 A | * | 11/1999 | Ishikawa ................. | H01L 33/62 257/E27.12 |
| 6,184,662 B1 | * | 2/2001 | Yabuuchi ................. | H03K 3/53 315/209 CD |
| 7,947,918 B2 | | 5/2011 | Buhler et al. | |
| 7,999,282 B2 | * | 8/2011 | Jeong .................... | H01L 25/167 257/E33.062 |
| 9,493,765 B2 | | 11/2016 | Krishnaswamy et al. | |

(Continued)

OTHER PUBLICATIONS

"High Power VCSELs for Gesture Recognition," 2012, Finisar Corporation, Sunnyvale, CA, 5 pages.

*Primary Examiner* — Dibson J Sanchez
(74) *Attorney, Agent, or Firm* — Harrity & Harrity, LLP

(57) ABSTRACT

A driver circuit, for generating narrow electrical pulses of high repetition rate with high peak current and low after pulse ringing to drive an optical load, may include a source, a first circuit path, and a second circuit path. The first circuit path may be connected to the source and may include inductive elements and a switch. The switch being in a closed state may charge current in the inductive elements through the first circuit path. The second circuit path may connect to the optical load and may be connected to the source. The second circuit path may include the inductive elements and a capacitive element in series with the optical load. The switch transitioning from the closed state to an open state may discharge current from the inductive elements through the second circuit path to provide an electrical pulse to the optical load.

20 Claims, 8 Drawing Sheets

(56) References Cited

U.S. PATENT DOCUMENTS

| | | | |
|---|---|---|---|
| 10,158,211 B2 | 12/2018 | Barnes et al. | |
| 10,389,257 B2 * | 8/2019 | Ng | H02M 3/156 |
| 10,466,342 B1 * | 11/2019 | Zhu | G01S 17/10 |
| 2003/0016711 A1 | 1/2003 | Crawford | |
| 2007/0273862 A1 | 11/2007 | Barr | |
| 2010/0087699 A1 | 4/2010 | Peterchev | |
| 2011/0043790 A1 * | 2/2011 | Komamaki | G01M 11/3145 |
| | | | 356/73.1 |
| 2013/0120095 A1 * | 5/2013 | Weatherspoon | H01F 17/0006 |
| | | | 336/200 |
| 2014/0204396 A1 | 7/2014 | Giger et al. | |
| 2014/0211192 A1 | 7/2014 | Grootjans et al. | |
| 2014/0266125 A1 * | 9/2014 | Athalye | H05B 45/3725 |
| | | | 323/299 |
| 2015/0092805 A1 * | 4/2015 | Mitsuyama | H01S 5/0261 |
| | | | 372/38.09 |
| 2015/0257222 A1 * | 9/2015 | Siessegger | H05B 45/39 |
| | | | 315/186 |
| 2016/0079731 A1 * | 3/2016 | Cheng | H01S 5/06253 |
| | | | 372/25 |
| 2016/0135260 A1 * | 5/2016 | Chang | H05B 45/3725 |
| | | | 315/200 R |
| 2018/0261975 A1 * | 9/2018 | Pavlov | G01S 7/4816 |
| 2019/0229493 A1 * | 7/2019 | Stern | H01S 5/0428 |
| 2019/0257947 A1 * | 8/2019 | Zhang | G01S 17/89 |
| 2021/0111533 A1 * | 4/2021 | Mousavian | G01S 17/10 |

* cited by examiner

METHODS FOR DRIVING OPTICAL LOADS AND DRIVER CIRCUITS FOR OPTICAL LOADS

RELATED APPLICATION

This application claims priority to U.S. Provisional Patent Application No. 62/836,556 for "Circuits for Generation of High-Power Ultra-Short Laser Pulses," filed on Apr. 19, 2019, the content of which is incorporated by reference herein in its entirety.

TECHNICAL FIELD

The present disclosure relates generally to driver circuits for optical loads and to methods and driver circuits for generating narrow electrical pulses with high peak current and low ringing to drive optical loads.

BACKGROUND

Time-of-flight-based measurement systems, such as light detection and ranging (LIDAR) systems, emit optical pulses, detect reflected optical pulses, and determine distances to objects by measuring delays between the emitted optical pulses and the reflected optical pulses.

SUMMARY

According to some implementations, a driver circuit, for generating narrow electrical pulses of high repetition rate with high peak current and low after pulse ringing to drive an optical load, may include: a direct current voltage source; a first circuit path connected to the direct current voltage source, wherein the first circuit path includes: a switch having an open state and a closed state, and one or more inductive elements, wherein the switch being in the closed state is to cause current to charge the one or more inductive elements through the first circuit path; and a second circuit path to connect to the optical load, wherein the second circuit path is connected to the direct current voltage source, and wherein the second circuit path includes: the one or more inductive elements, a resistive element, and a capacitive element in series with the optical load, and wherein the switch being in the open state is to cause the one or more inductive elements to discharge current through the second circuit path to provide an electrical pulse to the optical load.

According to some implementations, an optical device may include: a source to provide an input; an optical load to emit light when provided an input greater than a threshold; a first circuit path connected to the source, wherein the first circuit path includes: a switch having an open state and a closed state, and one or more inductive elements, wherein the switch being in the closed state is to cause energy to charge the one or more inductive elements through the first circuit path; and a second circuit path connected to the optical load and connected to the direct current voltage source, and wherein the second circuit path includes: the one or more inductive elements, the optical load, and a capacitive element in series with the optical load, and wherein the switch transitioning from the closed state to the open state is to cause the one or more inductive elements to discharge energy through the second circuit path to provide an electrical pulse to the optical load, and wherein an optical pulse from the optical load, in response to the electrical pulse, has a width in a range from 30 picoseconds to 1,000 picoseconds.

According to some implementations, a method, for generating narrow electrical pulses with high peak current to drive an optical load, may include charging, with a source, one or more inductive elements by closing, for a first time interval, a switch to provide current through a first circuit path to the one or more inductive elements; and driving the optical load by opening, for a second time interval after the first time interval, the switch to discharge current from the one or more inductive elements through a second circuit path to provide an electrical pulse to the optical load, wherein the second circuit path includes a capacitive element in series with the optical load.

DETAILED DESCRIPTION

Figure 1:
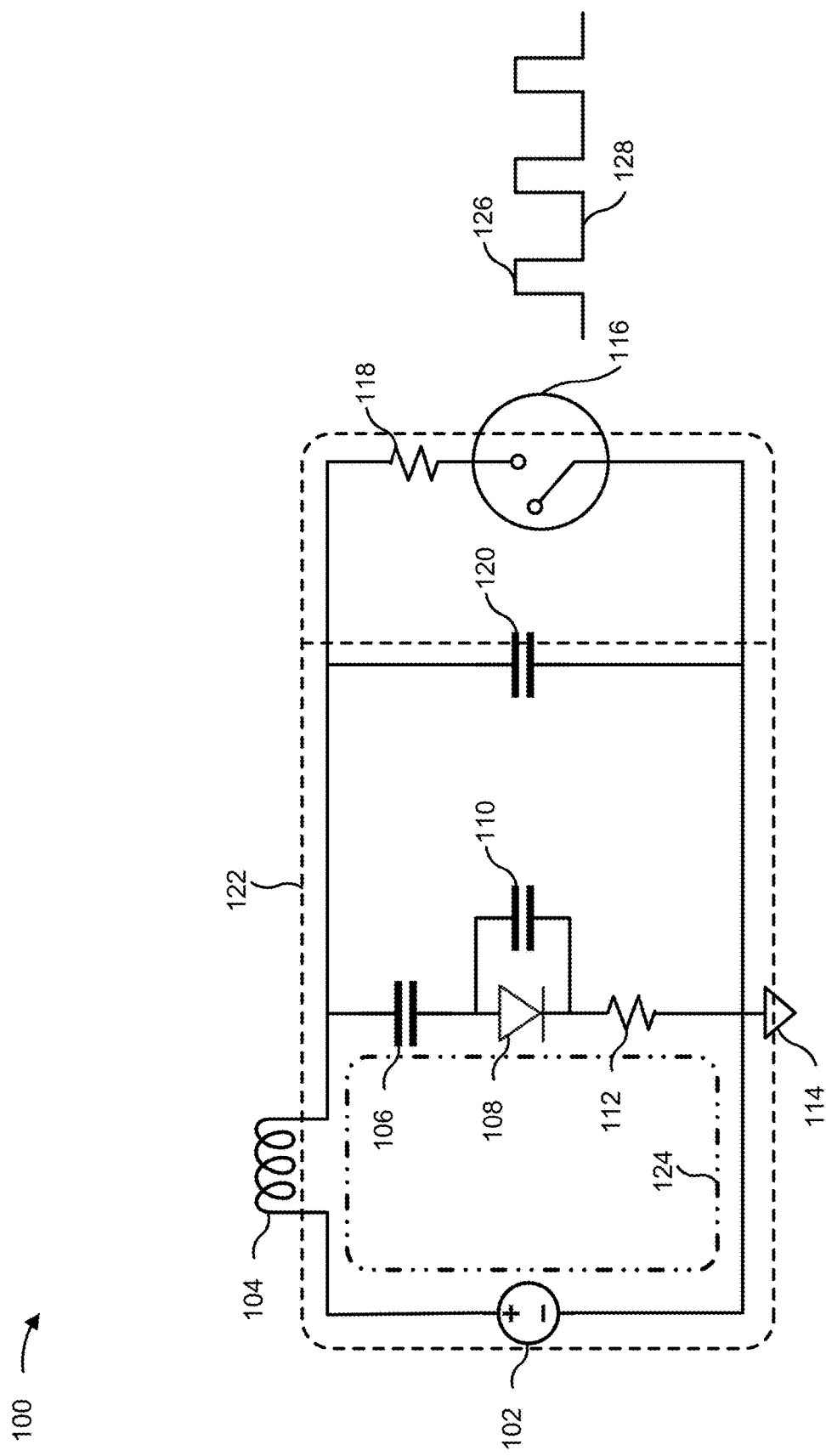
FIG. 1 is a circuit diagram of an example implementation of a driver circuit and optical load described herein.

The following detailed description of example implementations refers to the accompanying drawings. The same reference numbers in different drawings may identify the same or similar elements.

Time-of-flight-based measurement systems, such as LIDAR systems, require high power optical pulses of short duration (e.g., 10 nanoseconds (ns) or less). High power optical pulses may enable greater distance range finding. Shorter duration optical pulses may enable improved resolution. For a laser-based optical load (e.g., a laser diode, a semiconductor laser diode, a vertical-cavity surface-emitting laser (VCSEL), and/or the like), a higher electrical current across the optical load corresponds to a higher power optical pulse. As noted, time-of-flight-based measurement systems may determine distances to objects by measuring delays between an emitted optical pulse and a reflected optical pulse. Emitting pulses having a well-defined origin in time and rectangular shape simplifies the measurements. To achieve such a rectangular shape, emitted optical pulses should have short rise times (e.g., a time during which power of the optical pulse is rising from zero to peak power) and short fall times (e.g., a time during which power of the optical pulse is falling from peak power to zero).

A circuit for driving an optical load is a set of electronic components interconnected by current-carrying conductors (e.g. traces). Any of the electronic components and conductors may have parasitic elements (e.g., a parasitic inductance, a parasitic resistance, and/or a parasitic capacitance). These parasitic elements may be undesirable, and, therefore, sought to be minimized. However, it may not be possible to completely eliminate these parasitic elements. When a supply voltage is provided to the circuit to drive the optical load, the parasitic inductance, the parasitic resistance, and/or the parasitic capacitance in the circuit cause a delay between when the supply voltage is provided and when the current reaches a peak. The delay increases the rise time of the electrical pulse, which increases the rise time of the optical pulse. Increasing the supply voltage reduces the delay, but a 100 V supply voltage is required to achieve a 0.1 ns delay for a 10 amp (A) current in a circuit with low inductance (e.g., $10^{-9}$ nanohenries (nH)). Such a supply voltage is much higher than voltages provided by conventional power supplies for portable electronics (e.g., mobile devices, automotive electronics, consumer electronics, and/or the like). Such a large supply voltage may also be higher than rated voltages for switches in the circuit (e.g., switching FETs).

Furthermore, when the supply voltage is turned off, energy (e.g., magnetic energy) stored by the parasitic inductance, the parasitic resistance, and/or the parasitic capacitance of the electrical components generates a decaying, oscillating (e.g., ringing) current in the circuit, which increases the fall time of the electrical pulse, which increases the fall time of the optical pulse. Reducing peak current in the circuit reduces the stored energy but also reduces power of optical pulses.

Some implementations described herein provide a driver circuit for generating narrow (e.g., less than 1 ns in width) electrical pulses of high repetition rate (e.g., over 90 MHz and up to 1000 megahertz (MHz)) with high peak current (e.g., at least 5 A) and low after pulse ringing (e.g., totally absent second pulse after the initial pulse) to drive an optical load. The driver circuit may include a source, a first circuit path connected to the source for charging one or more inductive elements, and a second circuit path connected to the source and connected to the optical load. In some implementations, the first circuit path may include the one or more inductive elements and a switch having an open state and a closed state, where the switch being in the closed state charges (e.g., 10 ns charge time) current in the one or more inductive elements. In some implementations, the second circuit path may include the one or more inductive elements, a resistive element, and a capacitive element in series with the optical load, where the switch being in the open state discharges (e.g., 1 ns discharge time for a pulse) current from the one or more inductive elements through the second circuit path to provide an electrical pulse to the optical load.

In some implementations, the one or more inductive elements may include parasitic elements (e.g., elements having a parasitic inductance, a parasitic capacitance, and/or the like) in the driver circuit, and the parasitic elements may discharge current through the second circuit path to provide the electrical pulse to the optical load. In this way, the driver circuit may use, for example, parasitic inductance to provide an electrical pulse having a narrow width and high peak current at a high repetition rate.

In some implementations, the resistive element in the second circuit path may suppress oscillations in current and/or energy discharged from the one or more inductive elements. In this way, the driver circuit may reduce after pulse ringing.

FIG. 1 is a circuit diagram of an example implementation 100 of a driver circuit and optical load described herein. As shown in FIG. 1, an optical device may include a source 102, an inductive element 104, a first capacitive element 106, an optical load 108, a second capacitive element 110, a first resistive element 112, a ground 114, a switch 116, a second resistive element 118, and a third capacitive element 120. In some implementations, the driver circuit may include the inductive element 104, the first capacitive element 106, the second capacitive element 110, the first resistive element 112, the ground 114, the switch 116, the second resistive element 118, and the third capacitive element 120.

In some implementations, the source 102 may provide current to the driver circuit. For example, the source 102 may be a DC (direct current) voltage source, a DC current source with a resistive load, and/or the like.

In some implementations, the inductive element 104 may include one or more inductive elements of the driver circuit and/or may model a total inductance of the driver circuit. For example, the inductive element 104 may model inductances of current-carrying conductors in the driver circuit, bond wires in the driver circuit, the switch 116, the second resistive element 118, a trace included in the driver circuit to increase the total inductance of the driver circuit, and/or the like. Additionally, or alternatively, the inductive element 104 may include and/or model one or more parasitic elements in the driver circuit. Additionally, or alternatively, the second resistive element 118 and the third capacitive element 120 may model the resistance and capacitance, respectively, of the switch 116.

In some implementations, the driver circuit may include a first circuit path 122 that includes the inductive element 104, the switch 116, and the second resistive element 118. The switch 116 may have an open state (e.g., an off state), where, when the switch 116 is in the open state, current may not flow through the switch 116. Additionally, the switch 116 may have a closed state (e.g., an on state), where, when the switch 116 is in the closed state, current may flow through the switch 116. In some implementations, when the switch 116 is in the closed state, current charges the inductive element 104 (e.g., including one or more parasitic elements in the driver circuit) through the first circuit path 122. For example, and as shown by reference number 126 in FIG. 1, when the switch 116 is in the closed state, current may flow through the switch 116 and charge the inductive element 104 (e.g., including one or more parasitic elements in the driver circuit) through the first circuit path 122. In some implementations, when the switch 116 is in the closed state, current may flow through the switch 116 and charge the inductive element 104 through the first circuit path 122 during a first time interval (e.g., a charging time), where the first time interval is within a range from 1 ns to 20 ns. In some implementations, the first time interval is within a range from 1 ns to 10 ns (e.g., because in some implementations, charging for more than 10 ns may not increase pulse height).

In some implementations, the driver circuit may include a second circuit path 124 to connect to the optical load 108, where the second circuit path 124 includes the inductive element 104, the first capacitive element 106, the second capacitive element 110, and the first resistive element 112. In some implementations, the second capacitive element 110 may help to suppress after pulse ringing by dumping oscillating voltages across the optical load 108. In some implementations, when the switch 116 is in the open state, current discharges from the inductive element 104 (e.g., including one or more parasitic elements in the driver circuit) through the second circuit path 124 to provide an electrical pulse to the optical load 108. For example, and as shown by reference number 128 in FIG. 1, when the switch 116 is in the open state, current may not flow through the switch 116, and current discharges from the inductive element 104 (e.g., including one or more parasitic elements in the driver circuit) through the second circuit path 124 to provide an electrical pulse to the optical load 108. In some implementations, when the switch 116 is in the open state, current may not flow through the switch 116, and current discharges from the inductive element 104 through the second circuit path 124 to provide the electrical pulse to the optical load 108 during a second time interval (e.g., a discharge time), where the second time interval may be as short as 1 ns.

In some implementations, the first capacitive element 106 may be a blocking capacitor, and the optical load 108 may be an alternating-current-coupled (AC-coupled) optical load. For example, the first capacitive element 106 may be a blocking capacitor preventing the optical load 108 from emitting light when the switch 116 is in the closed state. In such an example, the source 102 may provide an input (e.g., a voltage, a current, and/or the like) to the driver circuit, where the input is greater than a threshold at which the optical load 108 emits light (e.g., a laser threshold voltage and/or the like). By providing an input greater than the threshold at which the optical load 108 emits light, the source 102 and the driver circuit may charge the inductive element 104 with a greater amount of energy in a shorter amount of time than if the input was limited by the threshold at which the optical load 108 emits light. If the first capacitive element 106, acting as a blocking capacitor, were absent, the source 102 may either undesirably cause the optical load 108 to emit light when the switch 106 was closed (e.g., if the input was greater than the threshold of the optical load), or the source 102 would be limited to providing an input lower than the threshold of the optical load, undesirably decreasing the amount of energy and/or amount of time for charging the inductive element 104.

By charging the inductive element 104 with a greater amount of energy, the source 102 and the driver circuit achieve a higher peak current for the electrical pulse when the inductive element 104 discharges current through the second circuit path 124 to provide the electrical pulse to the optical load 108 as compared to conventional driver circuits. In some implementations, the higher peak current of the electrical pulse generates emission, by the optical load 108, of an optical pulse having a higher peak power than peak power of optical pulses emitted in response to electrical pulses having lower peak current. In this way, the driver circuit enables the generation of higher power optical pulses from the optical load 108, which increases performance of a time-of-flight-based measurement system including the optical load 108.

Additionally, or alternatively, the higher peak current of the electrical pulse generates emission, by the optical load 108, of an optical pulse having a higher peak current than peak current of optical pulses emitted in response to electrical pulses having lower peak current. In this way, the driver circuit enables the generation of higher peak current optical pulses from the optical load 108, which increases performance of a time-of-flight-based measurement system including the optical load 108.

Additionally, or alternatively, small parasitic inductive elements 104 (e.g., in a range from 300 pH to 3,000 pH, such as in a range from 600 pH to 2,000 pH, and/or the like) may create a short electrical pulse that may reduce a rise time and a fall time of the electrical pulse, which may also reduce a rise time and a fall time of the optical pulse. By reducing the rise time and the fall time of the optical pulse, the driver circuit may enable the generation of more rectangularly-shaped optical pulses from the optical load 108 than may be achieved with higher rise times and fall times (e.g., of conventional driver circuits). In this way, the driver circuit may enable shorter, more rectangular optical pulses which may simplify measurements performed by, and increase performance of, a time-of-flight-based measurement system including the optical load 108.

Furthermore, by reducing the rise time and the fall time of the electrical pulse and reducing the rise time and the fall time of the optical pulse, the driver circuit enables the generation of narrower optical pulses (e.g., optical pulses having a narrow width in a time dimension) from the optical load 108 than may be achieved with higher rise times and fall times (e.g., of conventional driver circuits). For example, the driver circuit with the optical load 108 may generate an optical pulse having a width in a range from 30 picoseconds (ps) to 1,000 ps. By generating optical pulses having a narrower width, the driver circuit enables generation of optical pulses at a higher pulse repetition frequency than may be achieved with wider optical pulses. In this way, the driver circuit permits a higher pulse repetition frequency for a time-of-flight-based measurement system including the optical load 108, which may increase the performance (e.g., a spatial resolution) of the time-of-flight-based measurement system.

By charging the inductive element 104 of a small value in a shorter amount of time, the source 102 and the driver circuit enables generation of optical pulses at a higher pulse repetition frequency than may be achieved with longer charging times (e.g., of conventional driver circuits). A conventional driver circuit may have a large inductance (e.g., a few µH) and a corresponding large charging time (e.g., a few microseconds). In some implementations, the source 102 and the driver circuit may charge the inductive element 104 in a charging time in a range from 1 ns to 10 ns. For example, for an inductive element 104 having an inductance in a range from 600 pH to 2,000 pH, the source 102 and the driver circuit may charge the inductive element 104 in a charging time in a range from 2 ns to 5 ns. In some implementations, the pulse repetition frequency (e.g., a switching frequency) may be in a range from 20 kilohertz (kHz) to 1 gigahertz (GHz) (e.g., in a range from 50 MHz to 1 GHz). In some implementations, the pulse repetition frequency may depend on an application of the driver circuit. For example, a time-of-flight-based measurement system, such as a LIDAR system, may have a lower pulse repetition frequency to allow a signal, in response to an initial pulse, to return from a reflecting surface and register on a detector before sending a subsequent pulse.

Additionally, or alternatively, by enabling the generation of higher peak power and narrower optical pulses (e.g., by achieving a higher peak current for the electrical pulse, by reducing the rise time and the fall time of the electrical pulse, and/or the like), the driver circuit may permit a time-of-flight-based measurement system including the optical load 108 to have lower total power consumption than a conventional drive circuit with optical load.

In some implementations, the inductive element 104 may include a trace (e.g., a circuit trace on a printed circuit board (PCB), a wire trace, a track, and/or the like) having a length and width based on required total inductance taking into account parasitic inductance of other circuit elements (e.g., current-carrying conductors in the driver circuit, bond wires in the driver circuit, and/or the like). In some implementations, the trace may have a length and width to achieve a total inductance for the driver circuit. For example, the trace may be designed (e.g., have a length and width and/or the like) to add inductance to the driver circuit, thereby increasing the total inductance for the driver circuit. In some implementations, the trace may have a length and width to achieve, for the driver circuit, a total inductance satisfying a current threshold for the optical load 108. For example, total inductances in a range from 300 picohenries (pH) to 3,000 pH may satisfy the threshold.

Additionally, or alternatively, the trace may have a length and width to achieve, for the driver circuit, a total inductance satisfying a threshold, where total inductances satisfy the threshold if energy stored by inductive elements in the driver circuit generates, when discharged, a peak current of the electrical pulse that satisfies a threshold current of the optical load (e.g., a threshold current in a range from hundreds of milliamps (mA) to 3 amps (A) and/or the like). For example, the trace may be designed (e.g., have a length and width and/or the like) based on the peak current desired in the optical load 108.

In an example operation of an implementation of the driver circuit, when the switch 116 is closed (e.g., in the closed state), the current from DC source 102 is not going through the optical load 108, and current going through the first circuit path causes energy to be stored in inductive elements in the driver circuit for the duration of the 116 switch being closed. When the switch 116 is opened (e.g., in the open state), reversed current from the inductive elements in the driver circuit may now pass through load 108 generating an optical pulse. The peak of current through the optical load 108 may be controlled by designing traces of the driver circuit with desired parasitic inductance. Such a driver circuit takes advantage of the parasitic inductance in the driver circuit to generate short pulses of high current through the optical load 108.

In some implementations, the switch 116 may be a high speed and low output capacitance switch for generating narrow electrical pulse widths and may be a transistor, such as a field effect transistor (FET), a metal-oxide semiconductor field-effect transistor (MOSFET), a Gallium Nitride field-effect transistor (GaNFET), avalanche transistor, and/or the like. As noted above, the second resistive element 118 and the third capacitive element 120 may model the resistance and capacitance, respectively, of the switch 116. In some implementations, the third capacitive element 120 may affect the pulse height and width (e.g., amplitude and duration) of the electrical pulse from the drive circuit. For example, with increased capacitance in third capacitive element 120, the electrical pulse may become smaller and wider (e.g., reduced amplitude and increased time duration). In some implementations, energy stored in the inductive element 104 may bypass the optical load 108 and pass through the third capacitive element 120, and, as capacitance of the third capacitive element 120 increases, fall time of the electrical pulse may increase.

As shown in FIG. 1, the driver circuit may include the second capacitive element 110 connected in parallel to the optical load 108. In some implementations, the second capacitive element 110 may adjust a shape of the electrical pulse provided to the optical load 108. For example, the second capacitive element 110 may adjust the shape of the electrical pulse to have shorter rise time than a shape of an electrical pulse generated by a driver circuit without the second capacitive element 110. By providing an electrical pulse with shorter rise time to the optical load 108, the driver circuit may enable the generation of shorter rise time optical pulses from the optical load 108 than may be achieved with a long rise time electrical pulse (e.g., of conventional driver circuits without a capacitor in parallel with the optical load).

In some implementations, the first resistive element 112 in the second circuit path 124 may suppress oscillations in current discharged from the inductive element 104. In some implementations, when the switch 116 is in the open state and current discharges from the inductive element 104 through the second circuit path 124, the current may be a decaying, oscillating (e.g., ringing) current. For example, the current may include an initial pulse having a high peak current followed by additional pulses with lower peak currents. In some implementations, the first resistive element 112 may decrease the amplitude of the additional electrical pulses to a level below an emission threshold for the optical load 108. In this way, the driver circuit may reduce after pulse ringing.

In some implementations, the optical load 108 may include an array of one or more light-emitting diodes, an array of one or more laser diodes, an array of one or more semiconductor laser diodes, an array of one or more vertical-cavity surface-emitting lasers (VCSELs), and/or the like. In some implementations, the optical load 108 may comprise multiple optical loads electrically connected in parallel or in series. For example, the optical load 108 may include a VCSEL array with 400 emitters electrically connected in parallel. As another example, the optical load 108 may include multiple VCSELs (e.g., arrays or singlets) connected in series (e.g., on a printed circuit board (PCB)), which may provide increased optical power as compared to a single VCSEL array.

In some implementations, an optical device may include the source 102, the driver circuit, and the optical load 108. For example, the optical device may be a time-of-flight-based measurement system, such as a LIDAR system. In some implementations, a LIDAR system (e.g., a vehicle-based LIDAR system, a three-dimensional-sensing LIDAR system, a consumer electronic device, a handheld device, a tablet, a mobile phone, a consumer appliance, a payment kiosk system, and/or the like) may include the source 102, the driver circuit, and the optical load 108.

As indicated above, FIG. 1 is provided merely as an example. Other examples may differ from what is described with regard to FIG. 1.

Figure 2:
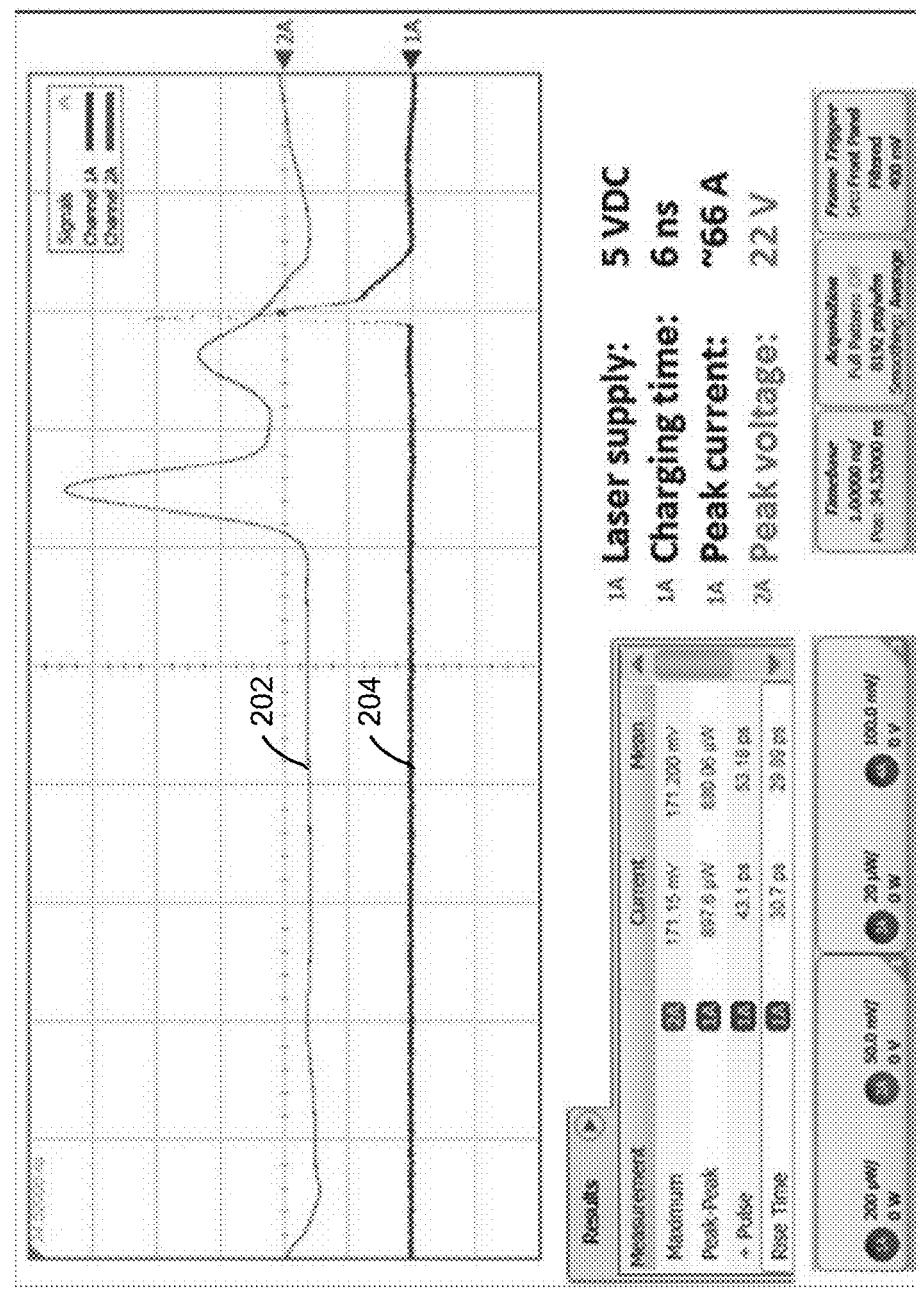
FIG. 2 is a diagram of an example graph plotting an electrical signal and an optical signal associated with an example implementation of a driver circuit and optical load described herein.

FIG. 2 is a diagram of an example graph 200 (e.g., that might be obtained from an oscilloscope measuring the electrical output 2A of the drive circuit and optical output 1A of the optical load) plotting an electrical signal and an optical signal associated with an example implementation of a driver circuit and optical load 108 described herein. For example, the driver circuit may be similar to the driver circuit described with respect to FIG. 1. The example graph 200 plots an electrical signal 202 provided by the driver circuit to an optical load 108 that is an AC-coupled VCSEL array, and an optical signal 204 generated by the AC-coupled VCSEL array in response to the electrical signal 202. In FIG. 2, the electrical signal 202 and the optical signal 204 are out of alignment in the time domain by at least eight nanoseconds due to, for example, a data acquisition delay due to differences in equipment used to capture the electrical signal 202 and the optical signal 204. In this example, a source provided 5 volts (V) of DC current to the driver circuit, and the driver circuit was charged (e.g., while a switch in a first path of the driver circuit was in the closed state/on position) for a charging time of 6 ns. The driver circuit discharged a current (e.g., through a second circuit path and while the switch in the first path of the driver circuit was in the open state/off position), where the current provided, to the AC-coupled laser, included an electrical pulse having a peak voltage of 22 V. The AC-coupled laser generated an optical pulse having a DC-equivalent peak current greater than 60 A (e.g., approximately 66 A) and a pulse width of less than 0.1 ns. Furthermore, the electrical signal 202 had an initial pulse having a high peak voltage followed by one additional pulse with lower peak voltage, which indicates reduced ringing. There was no ringing in the optical signal 204.

Figure 3:
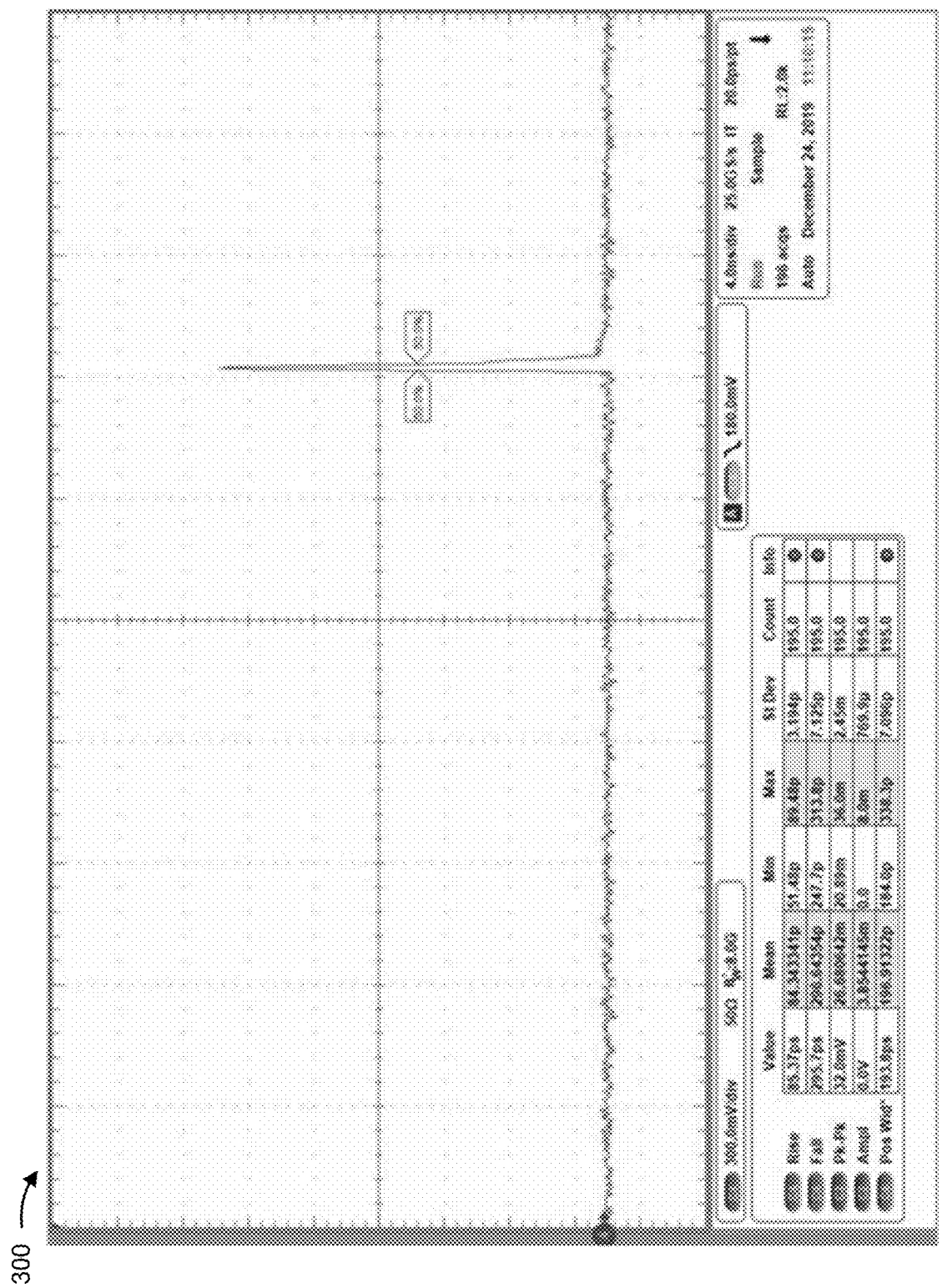
FIG. 3 is a diagram of an example graph plotting voltages from an optical detector receiving an optical signal associated with an example implementation of a driver circuit and optical load described herein.

FIG. 3 is a diagram of an example graph 300 (e.g., that might be obtained from an oscilloscope) plotting voltages from an optical detector receiving an optical signal associated with an example implementation of a driver circuit and optical load described herein. For example, the driver circuit may be similar to the driver circuit described with respect to FIG. 1. The example graph 300 plots an optical signal generated by an AC-coupled VCSEL array in response to an electrical signal provided, by the driver circuit, to the AC-coupled VCSEL array. A source provided 12 volts (V) of DC current to the driver circuit, and the driver circuit charged parasitic inductance of about 500 pH (e.g., while a switch in a first path of the driver circuit was in the closed state/on position) for a charging time of 10 ns. The driver circuit discharged a current from the parasitic inductance (e.g., through a second circuit path including the array of AC-coupled VCSELs, a 1 nF capacitor, and a 1 Ohm resistor and while the switch in the first path of the driver circuit was in the open state/off position), where the current provided, to the array of AC-coupled VCSELs, generated an optical pulse with width of about 190 ps. Furthermore, the optical signal had an initial pulse having a high peak current without any following pulses, which indicates reduced ringing. In FIG. 3, limitations on measurement equipment (e.g. the bandwidth limitations on the oscilloscopes, parasitic aspects of the probe, EMI (Electro Magnetic Interference) from high speed switching FET (Field Effect Transistor), etc.) may make it difficult to provide clean and accurate measurements of sub-nano second or picosecond electrical pulses directly from the driver circuit. Accordingly, simulations may be used to estimate peak current provided by the drive circuit to an optical load.

Figure 4:
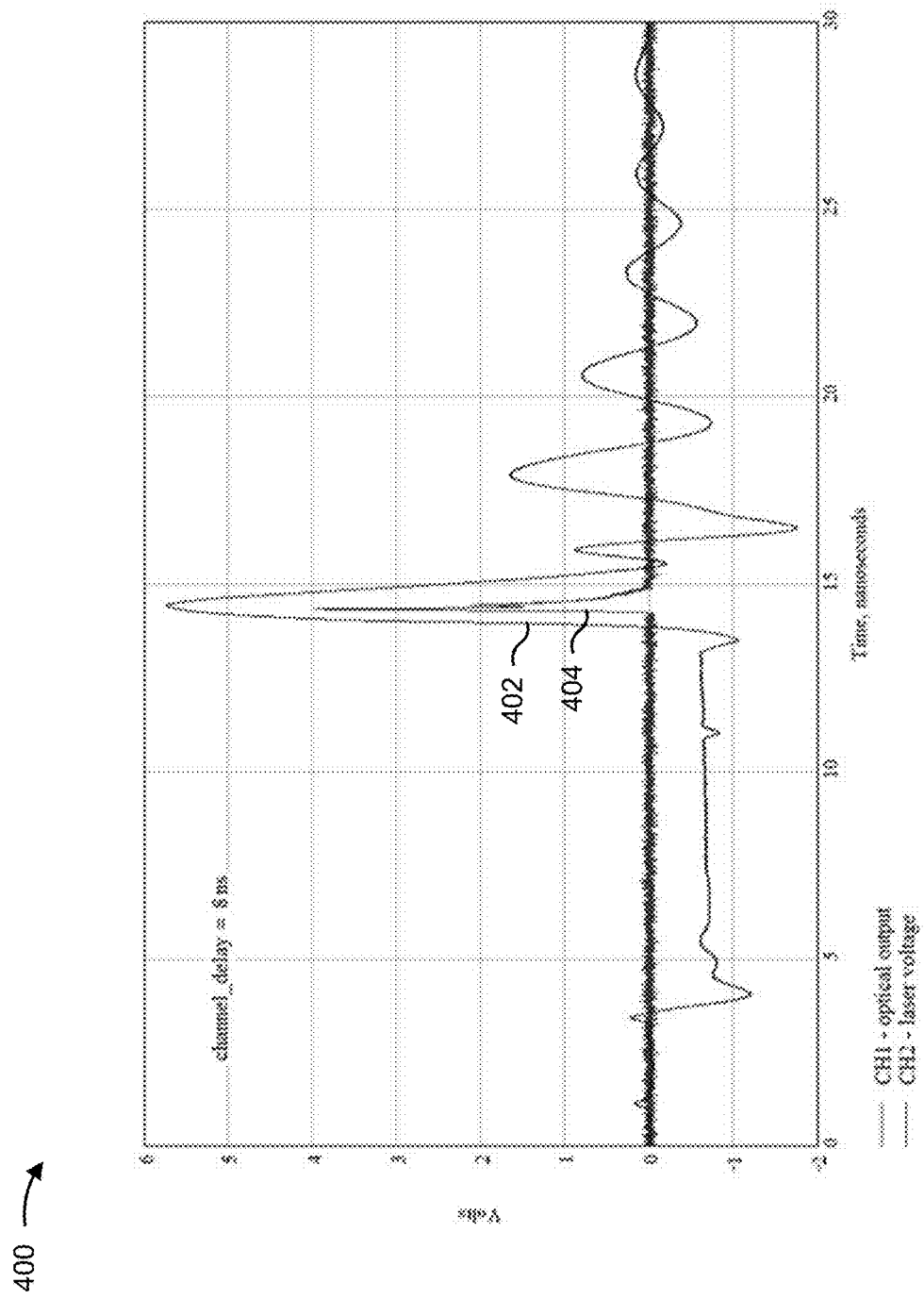
FIG. 4 is a diagram of an example graph plotting an electrical signal and an optical signal associated with an example implementation of a driver circuit and optical load described herein.

FIG. 4 is a diagram of an example graph 400 plotting an electrical signal 402 and an optical signal 404 (e.g., a voltage measured from a photodetector receiving the optical signal) associated with an example implementation of a driver circuit and optical load 108 described herein. For example, the driver circuit may be similar to the driver circuit described with respect to FIG. 1. The example graph 400 plots an electrical signal 402 provided by the driver circuit to a laser having a threshold voltage of about 1.5 V, and an optical signal 404 generated by the laser in response to the electrical signal 402. In FIG. 4, the electrical signal 402 and the optical signal 404 have been aligned in the time domain (e.g., to correct for data acquisition differences such as differences in equipment used to capture the electrical signal 402 and the optical signal 404 and/or the like). Due to limitations in measurement equipment (e.g., such as described above) measurements of absolute voltages or optical power may not be clean or accurate, but the relative relationship between, and correlation of, the electrical signal 402 and the optical signal 404 are significant. As shown in FIG. 4, and by the optical signal 404, even after the electrical signal 402 has reached the threshold voltage, the laser remains dark (e.g., does not emit an optical pulse) for a duration of time corresponding to a characteristic relaxation oscillation period of about 0.1 ns. The electrical signal 402 continues to rise, which builds photon population and stores energy in a cavity of the laser. When the photon population reaches a peak, and the laser emits an optical pulse, the natural decay of inductor discharge current reduces current flow to the laser, resulting in an optical pulse with a narrow width. For example, and as shown in FIG. 4, the optical signal 404 includes an optical pulse having a width of 0.08 ns and no secondary pulses. As also shown in FIG. 4, driving the laser with the driver circuit generated an optical pulse having an optical pulse width that is narrower than an electrical pulse width of an electrical pulse in the electrical signal 402. For example, the optical pulse width may be less than one-tenth of the electrical pulse width.

In some implementations, the example implementation of the driver circuit and the optical load 108 associated with FIG. 4 may achieve 200 MHz pulse repetition rates (e.g., a period of 5 ns) corresponding to a less than 4.7 ns charging cycle for 0.3 ns pulse. Additionally, or alternatively, the example implementation of the driver circuit and the optical load 108 associated with FIG. 4 may generate pulse peak equivalent currents up to 40 A (e.g., 5 A or greater) without ring-down distortion (e.g., after pulse oscillating currents and/or voltages).

Figure 5:
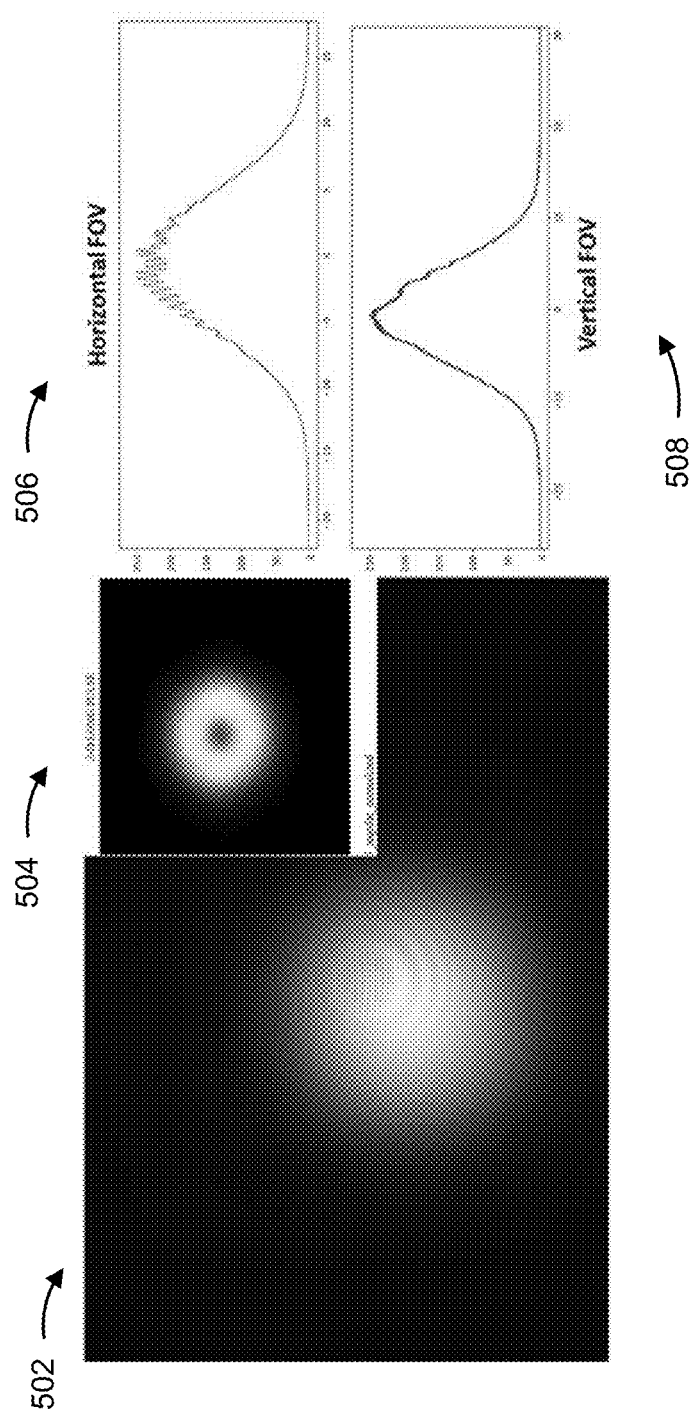
FIG. 5 is a diagram including an example image of a far field pattern of a 400-emitter VCSEL array optical load driven by an example implementation of a driver circuit, an example image of the 400-emitter VCSEL array optical load driven by a conventional driver circuit, and example graphs plotting cross-sections of the far field pattern of the 400-emitter VCSEL array optical load driven by the example implementation of a driver circuit described herein.
Figure 6:
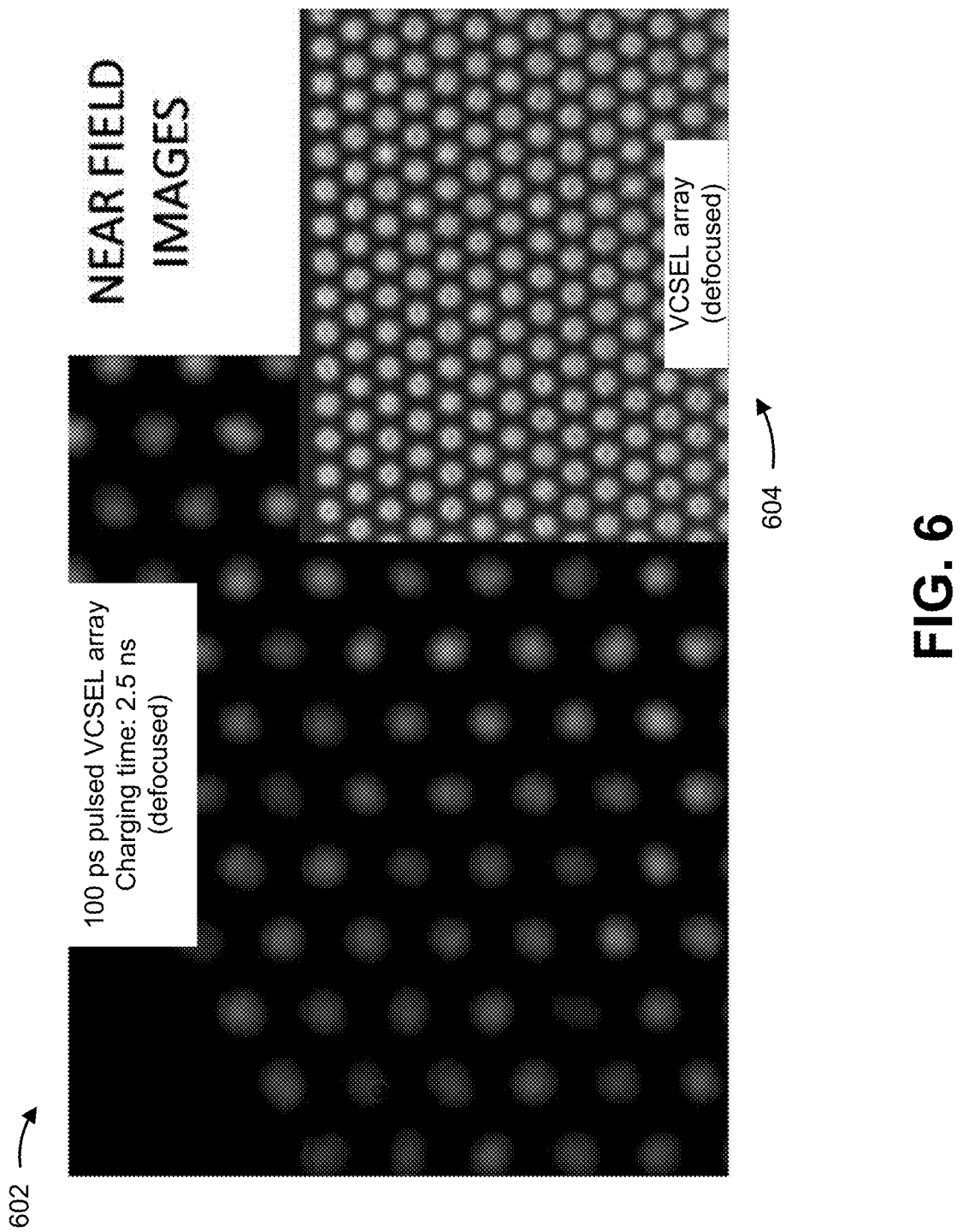
FIG. 6 is a diagram including an example image 602 of a near field pattern of the 400-emitter VCSEL array optical load driven by an example implementation of a driver circuit and an example image 604 of a near field pattern of the 400-emitter VCSEL array optical load driven by a conventional drive circuit described herein.

FIG. 5 is a diagram including an example image 502 of a far field pattern of a 400-emitter VCSEL array optical load driven by an example implementation of a driver circuit, an example image 504 of the 400-emitter VCSEL array optical load driven by a conventional driver circuit, and example graphs 506, 508 plotting cross-sections of the far field pattern (shown in example image 502) of the 400-emitter VCSEL array optical load driven by the example implementation of a driver circuit. FIG. 6 is a diagram including an example image 602 of a near field pattern of the 400-emitter VCSEL array optical load driven by an example implementation of a driver circuit and an example image 604 of a near field pattern of the 400-emitter VCSEL array optical load driven by a conventional drive circuit. In some implementations, a first VCSEL array, driven by a driver circuit similar to the driver circuit described with respect to FIG. 1, may generate optical pulses having an optical pulse width of less than 0.1 ns (e.g., 100 ps) with a charging time of 2.5 ns. When driven by a driver circuit similar to the driver circuit described with respect to FIG. 1, the first VCSEL array may generate a far field pattern as shown in the example image 502 and a near field pattern as shown in the example image 602. Thus, the far field pattern shown in example image 502 and the near field pattern shown in the example image 602 may be generated by optical pulses having an optical pulse width of less than 0.1 ns.

In some implementations, a second VCSEL array, driven by another driver circuit, may generate optical pulses having an optical pulse width of 10 ns. The second VCSEL array may generate a far field pattern as shown in the example image 504 and a near field pattern as shown in the example image 604. Thus, the far field pattern shown in example image 504 and the near field pattern shown in the example image 604 may be generated by optical pulses having an optical pulse width of 10 ns.

As shown in example image 502 and example image 602, for the optical pulses having an optical pulse width of less than 0.1 ns, the far field pattern and the near field pattern may radiate in a single spatial mode with a near-Gaussian profile. Example graphs 506, 508 respectively plot horizontal and vertical cross-sections of the far field pattern in example image 502 to show the near-Gaussian profile.

As shown in example image 504 and example image 604, for the optical pulses having an optical pulse width of 10 ns, the far field pattern and the near field pattern include a dark spot at a center of the far field pattern and a center of each spot in the near field pattern, which may indicate a circular interference pattern.

Figure 7:
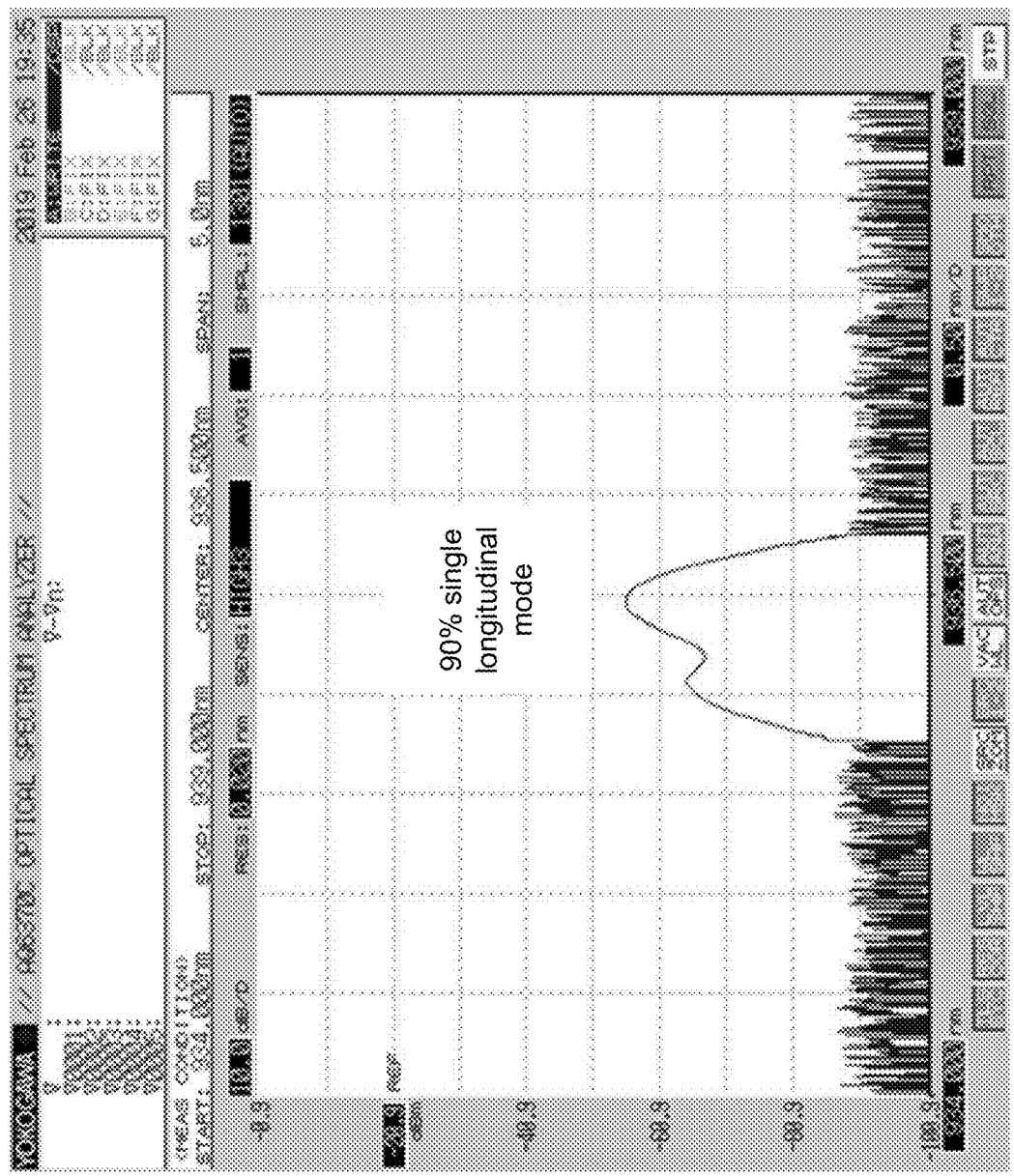
FIG. 7 is a diagram of a high-resolution spectrum of an optical load driven by an example implementation of a driver circuit described herein.

FIG. 7 is a diagram of a high-resolution spectrum 700 of an optical load driven by an example implementation of a driver circuit described herein. For example, the optical load may be similar to the 400-emitter VCSEL array optical load, described herein with respect to FIGS. 5 and 6, which, when driven by the example implementation of a driver circuit, emits optical pulses having an optical pulse width of less than 0.1 ns. As shown in FIG. 7, the high-resolution spectrum 700 indicates that about 90 percent of the VCSELs radiate in a single spatial mode (e.g., a single-frequency mode).

By driving optical loads to emit optical pulses with narrow widths and to radiate in a single spatial mode as shown and described with respect to FIGS. 5-7, example driver circuits may improve performance of time-of-flight-based measurement systems. For example, and as shown in FIGS. 5 and 6, the far field pattern and near field pattern may be uniform, which may improve a resolution of a time-of-flight-based measurement system.

As indicated above, FIGS. 2-7 are provided merely as one or more examples. Other examples may differ from what is described with regard to FIGS. 2-7. For example, and in some implementations, the driver circuit may be implemented as an application-specific integrated circuit (ASIC), such as a hybrid ASIC containing high power switching FETs.

Figure 8:
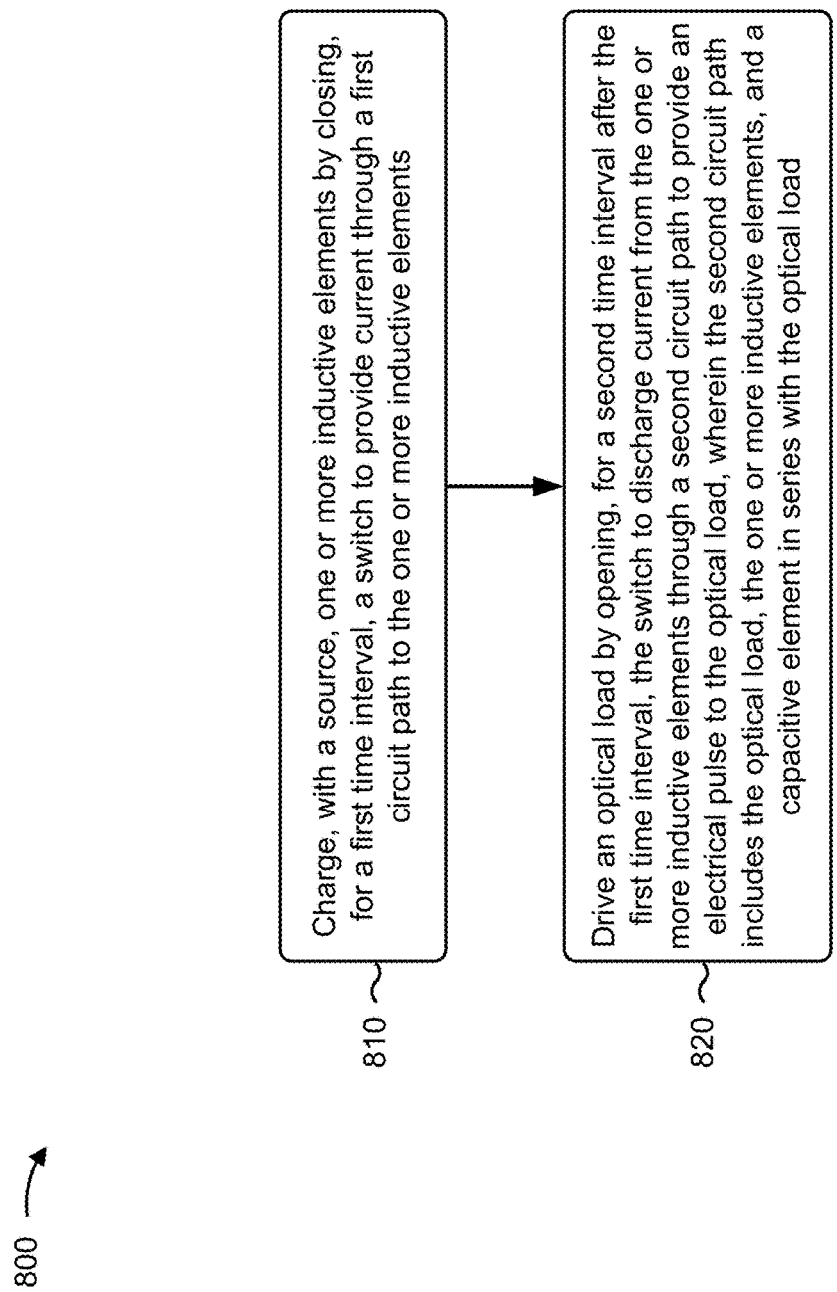
FIG. 8 is a flowchart of an example process for driving an optical load.

FIG. 8 is a flow chart of an example process 800 for driving an optical load. In some implementations, one or more process blocks of FIG. 8 may be performed by a driver circuit (e.g., a driver circuit similar to the driver circuit described with respect to FIG. 1). In some implementations, one or more process blocks of FIG. 8 may be performed by another device or a group of devices separate from or including the driver circuit, such as an optical device (e.g., a time-of-flight-based measurement system, a LIDAR system, a vehicle-based LIDAR system, a three-dimensional-sensing LIDAR system, a 3D sensing system, and/or the like) and/or the like.

As shown in FIG. 8, process 800 may include charging, with a source, one or more inductive elements by closing, for a first time interval, a switch to provide current through a first circuit path to the one or more inductive elements (block 810). For example, the driver circuit may charge, with a source (e.g., a DC voltage source), one or more inductive elements by closing, for a first time interval, a switch to provide current through a first circuit path to the one or more inductive elements, as described above.

As further shown in FIG. 8, process 800 may include driving the optical load by opening, for a second time interval after the first time interval, the switch to discharge current from the one or more inductive elements through a second circuit path to provide an electrical pulse to the optical load, wherein the second circuit path includes the optical load, the one or more inductive elements and a capacitive element in series with the optical load (block 820). For example, the driver circuit may drive the optical load by opening, for a second time interval after the first time interval, the switch to discharge current from the one or more inductive elements through a second circuit path to provide an electrical pulse to the optical load, as described above.

Process 800 may include additional implementations, such as any single implementation or any combination of implementations described below and/or in connection with one or more other processes described elsewhere herein.

In a first implementation, the first time interval is in a range from 1 nanosecond to 20 nanoseconds.

In a second implementation, alone or in combination with the first implementation, process 800 includes adjusting, with another capacitive element in parallel to the optical load, a shape of the electrical pulse provided to the optical load.

In a third implementation, alone or in combination with one or more of the first and second implementations, process 800 includes suppressing, with a resistor in the second circuit path, oscillations in current discharged from the one or more inductive elements to reduce after pulse ringing in the electrical pulse.

In a fourth implementation, alone or in combination with one or more of the first through third implementations, charging, with the source, the one or more inductive elements comprises charging the one or more inductive elements with an input, where the input is greater than a threshold at which the optical load emits light, where the capacitive element is a blocking capacitor, and process 800 further includes preventing, with the blocking capacitor and when the switch is open, the optical load from emitting light.

In a fifth implementation, alone or in combination with one or more of the first through fourth implementations, process 800 includes repeatedly charging the one or more inductive elements for the first time interval and driving the optical load for the second time interval to provide multiple electrical pulses to the optical load.

In a sixth implementation, alone or in combination with one or more of the first through fifth implementations, process 800 includes closing the switch to charge the one or more inductive elements and opening the switch to drive the optical load at a switching frequency, where the switching frequency is in a range from tens of kHz up to 100 MHz or even 1 gigahertz (GHz) (e.g., in a range from 50 MHz to 1 GHz).

Although FIG. 8 shows example blocks of process 800, in some implementations, process 800 may include additional blocks, fewer blocks, different blocks, or differently arranged blocks than those depicted in FIG. 8. Additionally, or alternatively, two or more of the blocks of process 800 may be performed in parallel.

The foregoing disclosure provides illustration and description, but is not intended to be exhaustive or to limit the implementations to the precise forms disclosed. Modifications and variations may be made in light of the above disclosure or may be acquired from practice of the implementations. For example, any of the implementations described herein may be combined with any other of the implementations described herein unless there is an express reason such implementations may not be combined.

Implementations are described herein in connection with thresholds. As used herein, satisfying a threshold may, depending on the context, refer to a value being greater than the threshold, more than the threshold, higher than the threshold, greater than or equal to the threshold, less than the threshold, fewer than the threshold, lower than the threshold, less than or equal to the threshold, equal to the threshold, or the like.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, a combination of related and unrelated items, etc.), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:

1. A driver circuit for generating narrow electrical pulses of high repetition rate with high peak current to drive an optical load, the driver circuit comprising:
   a source;
   a first circuit path connected to the source, wherein the first circuit path includes:
      a switch having an open state and a closed state, and
      one or more inductive elements,
         wherein the switch being in the closed state is to cause current to charge the one or more inductive elements through the first circuit path; and
   a second circuit path to connect to the optical load, wherein the second circuit path is connected to the source, and wherein the second circuit path includes:
      the one or more inductive elements,
      a resistive element,
      a first capacitive element in series with the optical load, and
      a second capacitive element in parallel with the optical load,
         wherein the switch transitioning from the closed state to the open state is to cause the one or more inductive elements to discharge current through the second circuit path to provide an electrical pulse to the optical load, and
         wherein the second capacitive element is to suppress after pulse ringing by dumping oscillating voltages across the optical load.

2. The driver circuit of claim 1, wherein the source is to provide an input greater than a threshold at which the optical load would emit light, and
   wherein the first capacitive element is a blocking capacitor preventing the optical load from emitting light when the switch is in the open state.

3. The driver circuit of claim 1, wherein the one or more inductive elements comprise a trace having a length and width to achieve, for the driver circuit, a total inductance satisfying a threshold.

4. The driver circuit of claim 3, wherein the total inductance satisfies the threshold if energy stored by the one or more inductive elements generates, when discharged, a peak current of the electrical pulse that satisfies a threshold current of the optical load.

5. The driver circuit of claim 1, wherein the switch being in the closed state is to cause current to charge the one or more inductive elements in a range from 1 nanosecond to 20 nanoseconds.

6. The driver circuit of claim 1, wherein, in response to the electrical pulse, the optical load is to emit an optical pulse having a width in a range from 30 picoseconds to 1,000 picoseconds.

7. The driver circuit of claim 1, wherein the resistive element is to suppress oscillations in energy discharged from the one or more inductive elements.

8. The driver circuit of claim 1, wherein the switch is a field effect transistor.

9. The driver circuit of claim 1, wherein the electrical pulse has a width less than 1 nanosecond and a peak current of at least 5 amps.

10. The driver circuit of claim 1, wherein a switching frequency of the switch is in a range from 50 megahertz to 1 gigahertz.

11. An optical device, comprising:
    a source to provide an input;
    an optical load to emit light when provided an input greater than a threshold;
    a first circuit path connected to the source, wherein the first circuit path includes:
       a switch having an open state and a closed state, and
       one or more inductive elements,
          wherein the switch being in the closed state is to cause energy to charge the one or more inductive elements through the first circuit path; and
    a second circuit path connected to the optical load and connected to the source, and wherein the second circuit path includes:
       the one or more inductive elements,
       the optical load,
       a first capacitive element in series with the optical load, and
       a second capacitive element in parallel with the optical load,
          wherein the switch transitioning from the closed state to the open state is to cause the one or more inductive elements to discharge energy through the second circuit path to provide an electrical pulse to the optical load,
          wherein an optical pulse from the optical load, in response to the electrical pulse, has a width in a range from 30 picoseconds to 1,000 picoseconds, and
          wherein the second capacitive element is to suppress after pulse ringing by dumping oscillating voltages across the optical load.

12. The optical device of claim 11, wherein the second circuit path further includes a resistive element to suppress oscillations in energy discharged from the one or more inductive elements.

13. The optical device of claim 11, wherein the switch is a field effect transistor.

14. The optical device of claim 11, wherein the source is to provide an input greater than a threshold at which the optical load would emit light.

15. The optical device of claim 11, wherein the optical load is at least one of an array of one or more light-emitting diodes, an array of one or more laser diodes, an array of one or more semiconductor laser diodes, or an array of one or more vertical-cavity surface-emitting lasers.

16. The optical device of claim 11, wherein the one or more inductive elements comprise a trace having a length and width to achieve a total inductance satisfying a threshold.

17. The optical device of claim 16, wherein the total inductance satisfies the threshold if energy stored by the one or more inductive elements generates, when discharged, a peak current of the electrical pulse that satisfies a threshold current of the optical load.

18. The optical device of claim 11, wherein the first capacitive element is a blocking capacitor preventing the optical load from emitting light when the switch is in the open state.

19. The optical device of claim 11, wherein the switch being in the closed state is to cause current to charge the one or more inductive elements in a range from 1 nanosecond to 20 nanoseconds.

20. The optical device of claim 11, wherein a switching frequency of the switch is in a range from 50 megahertz to 1 gigahertz.

\* \* \* \* \*